United States Patent
Lemke et al.

(10) Patent No.: US 9,406,550 B2
(45) Date of Patent: Aug. 2, 2016

(54) INSULATION STRUCTURE FORMED IN A SEMICONDUCTOR SUBSTRATE AND METHOD FOR FORMING AN INSULATION STRUCTURE

(71) Applicant: Infineon Technologies Austria AG, Villach (AT)

(72) Inventors: Marko Lemke, Dresden (DE); Rolf Weis, Dresden (DE); Ralf Rudolf, Dresden (DE)

(73) Assignee: Infineon Technologies Austria AG, Villach (AT)

( * ) Notice: Subject to any disclaimer, the term of this patent is extended or adjusted under 35 U.S.C. 154(b) by 135 days.

(21) Appl. No.: 14/068,378

(22) Filed: Oct. 31, 2013

(65) Prior Publication Data
US 2015/0115396 A1    Apr. 30, 2015

(51) Int. Cl.
| H01L 21/762 | (2006.01) |
| H01L 29/06 | (2006.01) |
| H01L 29/78 | (2006.01) |
| H01L 27/088 | (2006.01) |
| H01L 29/423 | (2006.01) |
| H01L 21/8234 | (2006.01) |

(52) U.S. Cl.
CPC ...... *H01L 21/76232* (2013.01); *H01L 27/0883* (2013.01); *H01L 29/0649* (2013.01); *H01L 29/0653* (2013.01); *H01L 29/78* (2013.01); *H01L 21/823481* (2013.01); *H01L 27/0886* (2013.01); *H01L 29/4236* (2013.01)

(58) Field of Classification Search
CPC ........ H01L 21/70; H01L 21/762; H01L 29/06

USPC .......................................... 438/221, 296, 353
See application file for complete search history.

(56) References Cited

U.S. PATENT DOCUMENTS

| 7,507,634 | B2 * | 3/2009 | Sato ....................... B82Y 20/00 257/E21.564 |
| 7,858,508 | B2 | 12/2010 | Fujimoto et al. |
| 7,906,388 | B2 | 3/2011 | Sonsky |
| 7,932,565 | B2 * | 4/2011 | Wu .................... H01L 21/76232 257/506 |
| 8,455,948 | B2 | 6/2013 | Weis |
| 8,569,842 | B2 | 10/2013 | Weis et al. |
| 2007/0235783 | A9 * | 10/2007 | Sandhu ............. H01L 21/76232 257/510 |
| 2009/0045482 | A1 | 2/2009 | Liaw et al. |
| 2010/0171170 | A1 * | 7/2010 | Hwang ........... H01L 21/823418 257/327 |
| 2011/0037142 | A1 | 2/2011 | Huang |
| 2013/0234279 | A1 | 9/2013 | Kim et al. |

FOREIGN PATENT DOCUMENTS

WO    2012093177 A2    7/2012

\* cited by examiner

*Primary Examiner* — Cuong Q Nguyen
(74) *Attorney, Agent, or Firm* — Murphy, Bilak & Homiller, PLLC

(57) ABSTRACT

A method for forming an insulation structure in a semiconductor body includes forming a trench extending from a first surface into a semiconductor body, the trench having a first width in a horizontal direction of the semiconductor body, and forming a void spaced apart from the first surface in a vertical direction of the semiconductor body, the void having a second width in a horizontal direction that is greater than the first width, wherein the trench and the void are arranged adjacent to each other in a vertical direction.

24 Claims, 18 Drawing Sheets

INSULATION STRUCTURE FORMED IN A SEMICONDUCTOR SUBSTRATE AND METHOD FOR FORMING AN INSULATION STRUCTURE

TECHNICAL FIELD

Embodiments of the present invention relate to an insulation structure formed in a semiconductor body and to a method for forming an insulation structure, especially to a method for forming an insulation structure for insulation of semiconductor devices on a semiconductor substrate.

BACKGROUND

Often, a large number of semiconductor devices, such MOSFETs (Metal Oxide Semiconductor Field-Effect Transistors) or IGBTs (Insulated-Gate Bipolar Transistors), is integrated in the same semiconductor body. Often it is desirable to make a distance between two neighboring devices as low as possible in order to be able to integrate as many semiconductor devices as possible in a given area of the semiconductor body. It is therefore necessary to form insulation structures between adjacent devices, to provide electrical isolation between them. Such an insulation structure may include a deep narrow trench that is etched into the semiconductor body and is filled with an oxide.

There is a need to provide an insulation structure that provides effective isolation between semiconductor devices integrated in the same semiconductor body and that can be implemented in a space-saving manner.

SUMMARY

One embodiment relates to a method for forming an insulation structure. The method includes forming a trench extending from a first surface into a semiconductor body, the trench having a first width in a horizontal direction of the semiconductor body, and forming a void spaced apart from the first surface in a vertical direction of the semiconductor body. The void has a second width in a horizontal direction that is greater than the first width, wherein the trench and the void are arranged adjacent to each other in a vertical direction.

Another embodiment relates to an insulation structure. The insulation structure includes a trench extending from a first surface into a semiconductor body, the trench having a first width in a horizontal direction of the semiconductor body. A void is spaced apart from the first surface in a vertical direction of the semiconductor body, the void having a second width in a horizontal direction that is greater than the first width, the trench and the void being arranged adjacent to each other in a vertical direction.

Those skilled in the art will recognize additional features and advantages upon reading the following detailed description, and upon viewing the accompanying drawings.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION

In the following detailed description, reference is made to the accompanying drawings, which form a part thereof, and in which are shown by way of illustration specific embodiments in which the invention may be practiced.

Figure 1A:
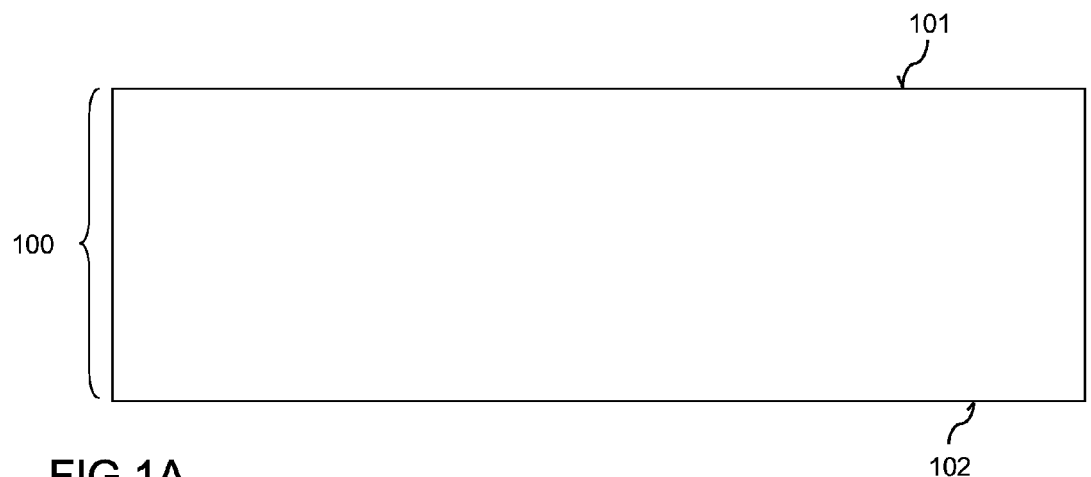
FIGS. 1A-1C illustrate vertical cross-sectional views of a semiconductor body that illustrate one example of a method for producing an insulation structure.
Figure 1B:
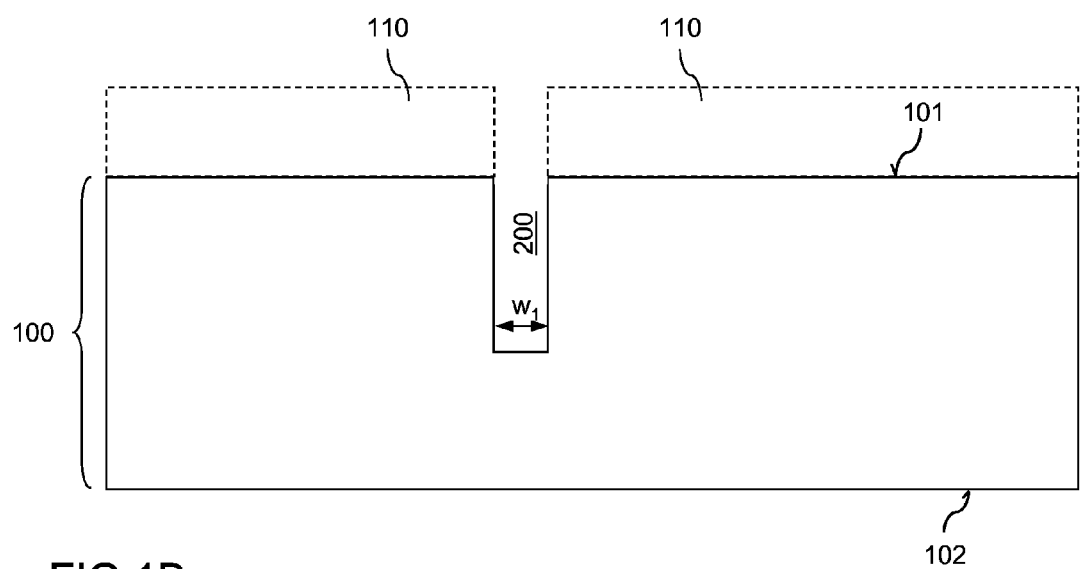
Figure 1C:
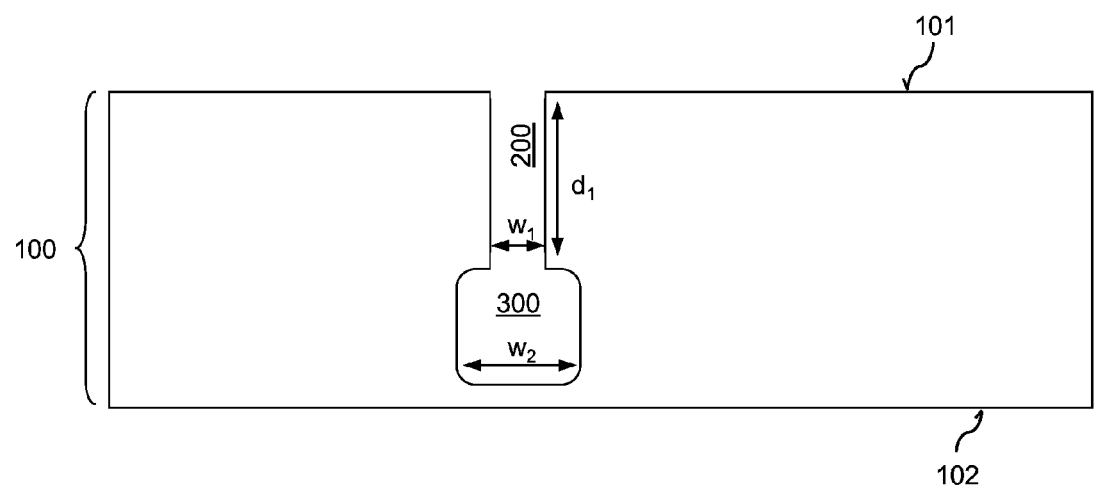

FIGS. 1A-1C illustrate an example of a method for forming an insulation structure. In a first step a semiconductor body 100 is provided. The semiconductor body 100 may be a wafer or part of a wafer, for example. The semiconductor body 100 has a first surface 101 and a second surface 102, opposite to the first surface 101. The semiconductor body 100 may include a conventional semiconductor material, such as silicon (Si), silicon carbide (SiC), gallium arsenide (GaAs), gallium nitride (GaN) or the like. FIG. 1A is a vertical cross-sectional view that shows the semiconductor body 100 in a vertical section plane that is perpendicular to the top surface 101 of the semiconductor body 100.

Referring to FIG. 1B, a trench 200 is formed in the semiconductor body 100. The trench 200 extends from the first surface 101 into the semiconductor body 100 in a vertical direction. The trench 200 may have a first width $w_1$ in a horizontal direction. Forming the trench 200 may include a conventional etching process using an etch mask 110 (illustrated in dashed lines in FIG. 1B)

Referring to FIG. 1C, a void 300 is formed in the semiconductor body 100. The void 300 is spaced apart from the first surface 101 in a vertical direction. The void 300 has a second width $w_2$ that is greater than the first width $w_1$ of the trench 200. The trench 200 and the void 300 are arranged adjacent to each other in a vertical direction of the semiconductor body 100. The trench 200 adjoins the void 300 and forms an opening for the void 300. The void may have a substantially rectangular cross-section, a substantially square cross-section or a substantially circular cross-section. However, these are only examples. The void 300 can be implemented with any other cross-section as well. Referring to FIGS. 1B and 10, the void 300 can be formed after forming the trench 200. However, it is also possible to form the void 300 before forming the trench 200. One embodiment of a method in which the void is formed before the trench is explained with reference to FIGS. 5A-5D herein below.

In a horizontal plane of the semiconductor body 100, the trench 200 and the void 300 can be implemented as an elongated structure. However, it is also possible to implement the trench 200 and the void 300 to be ring-shaped in the horizontal plane.

The insulation structure with the trench 200 and the void can be used to separate (insulate from each other) semiconductor devices (not shown in FIG. 1) that are adjacent both sides of the insulation structure. According to one embodiment, a depth $d_1$ of the trench 200 substantially corresponds to a depth of these semiconductor devices or is larger than a depth of these semiconductor devices. In this case, the insulation structure has a smaller width $w_1$ adjacent the semiconductor devices and a greater width $w_2$ below the semiconductor devices.

Figure 2A:
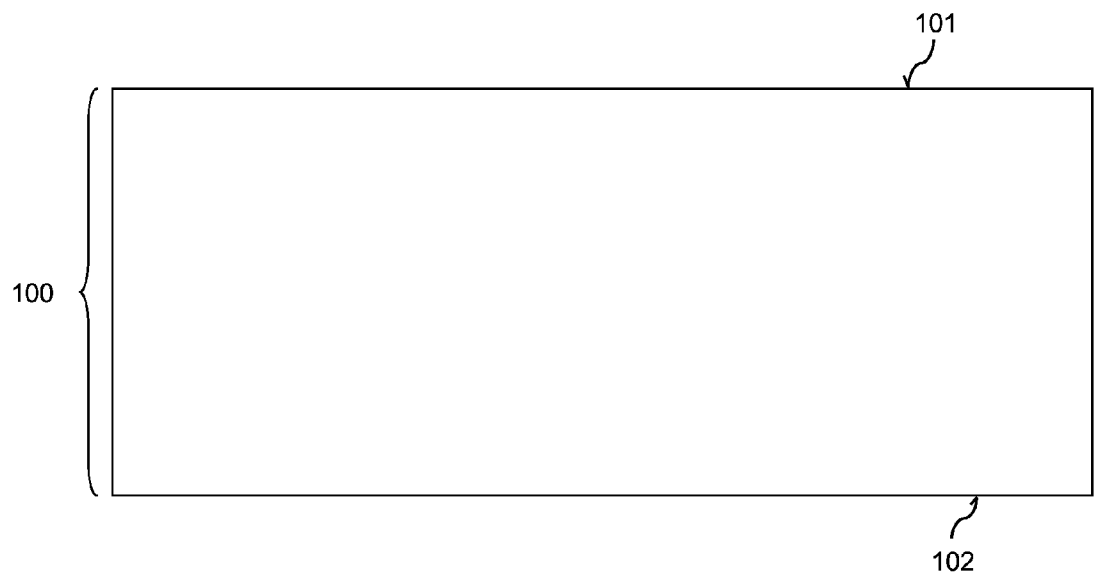
FIGS. 2A-2F illustrate vertical cross-sectional views of a semiconductor body that illustrate a further example of a method for producing an insulation structure.

For forming the trench 200 and the void 300 in the semiconductor body 100, different methods may be used. One possible method is now described with reference to FIGS. 2A-2F. FIG. 2A illustrate the semiconductor body 100 at the beginning of the method.

Before forming the trench 200, the etch mask 110 is produced on the first surface 101. This etch mask 110 may include at least one of a nitride, and an oxide and can be produced in a conventional way by forming a mask layer on the first surface 101, and by structuring the mask layer using a photo technique. The mask 110 leaves those sections of the first surface 101 uncovered where the trench 200 is to be produced.

Figure 2B:
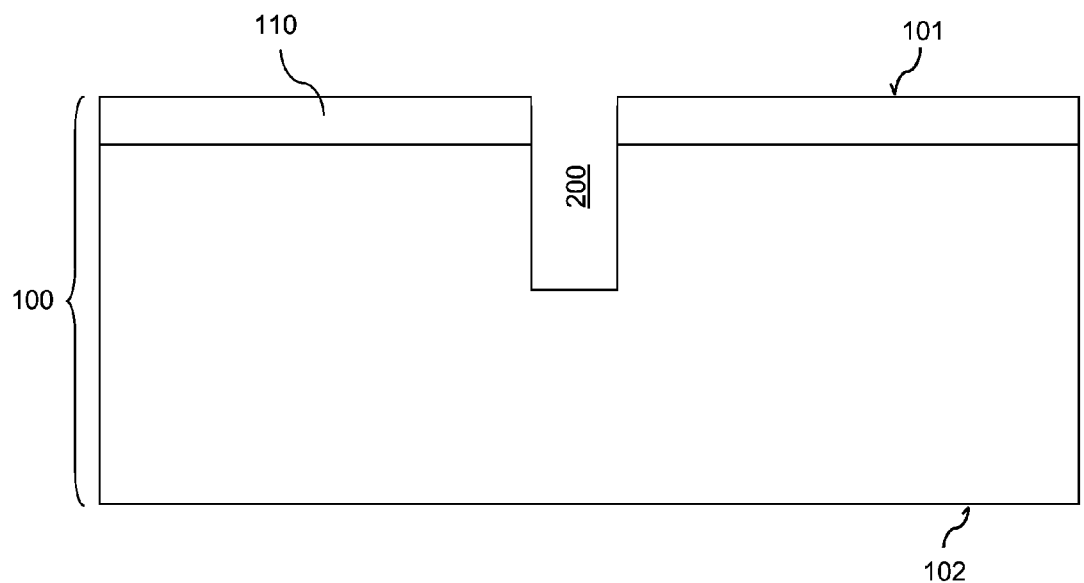

Referring to FIG. 2B, the trench 200 is then produced in the semiconductor body 100 using the etch mask. The trench 200 extends from the first surface 101 into the semiconductor body 100 in a vertical direction. For forming the trench 200, a conventional etching process may be used that etches the material of the semiconductor body selectively relative to the material of the etch mask 110. According to one embodiment, the etching process is an anisotropic etching process, which is an orientation dependent etching process.

Figure 2C:
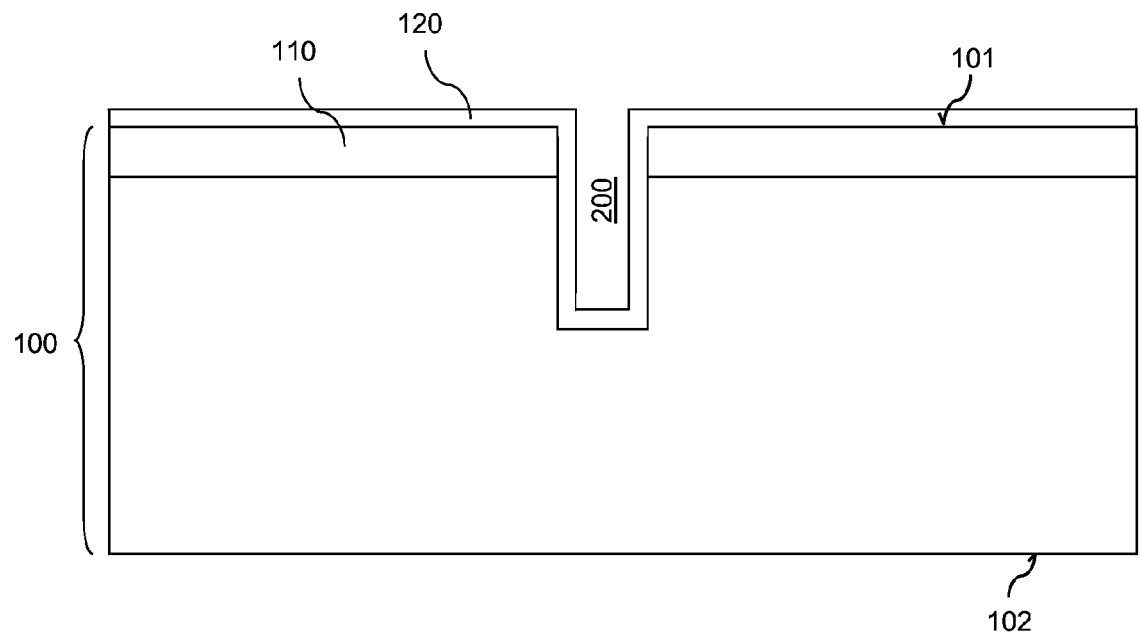
Figure 2D:
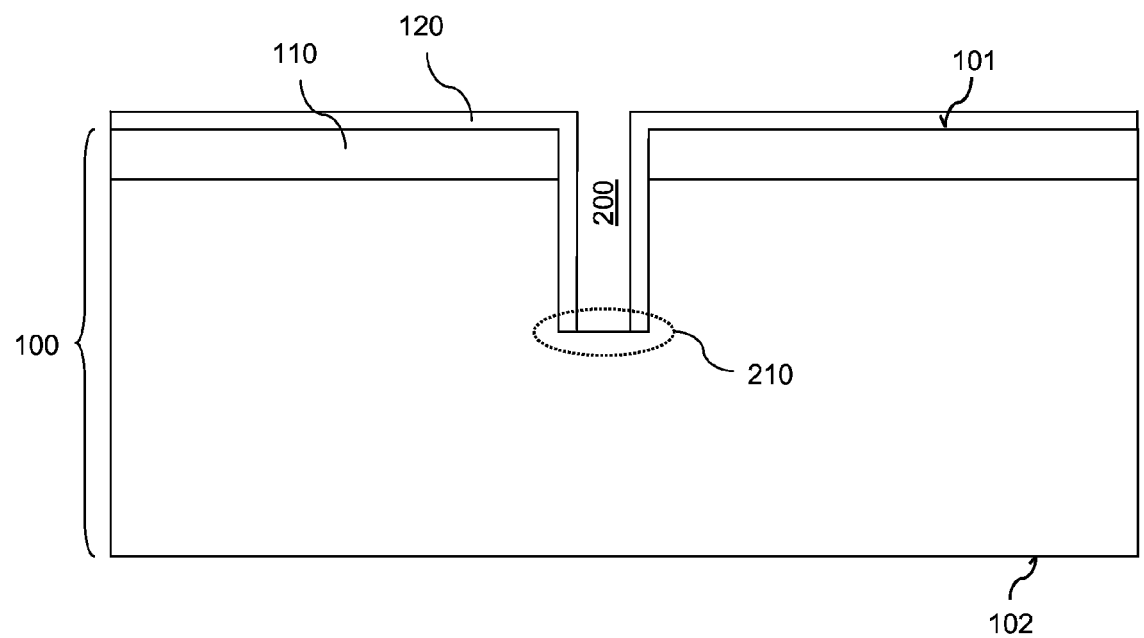

In a following step, illustrated in FIG. 2C, an etch stop layer (protection layer) 120 may be formed in the trench 200 and on the first surface 101. The etch stop layer 120 may be a thin oxide layer or a thin nitride layer. Such layers 120 can be referred to as oxide liner or nitride liner. The etch stop layer 120 may be formed using conventional techniques, such as a chemical vapor deposition (CVD), low pressure chemical vapour deposition LPCVD), atomic layer deposition (ALD) or the like Referring to FIG. 2D, an anisotropic etching process may then be performed to remove portions of the etch stop layer 120 at the bottom 210 of the trench 200.

Figure 2E:
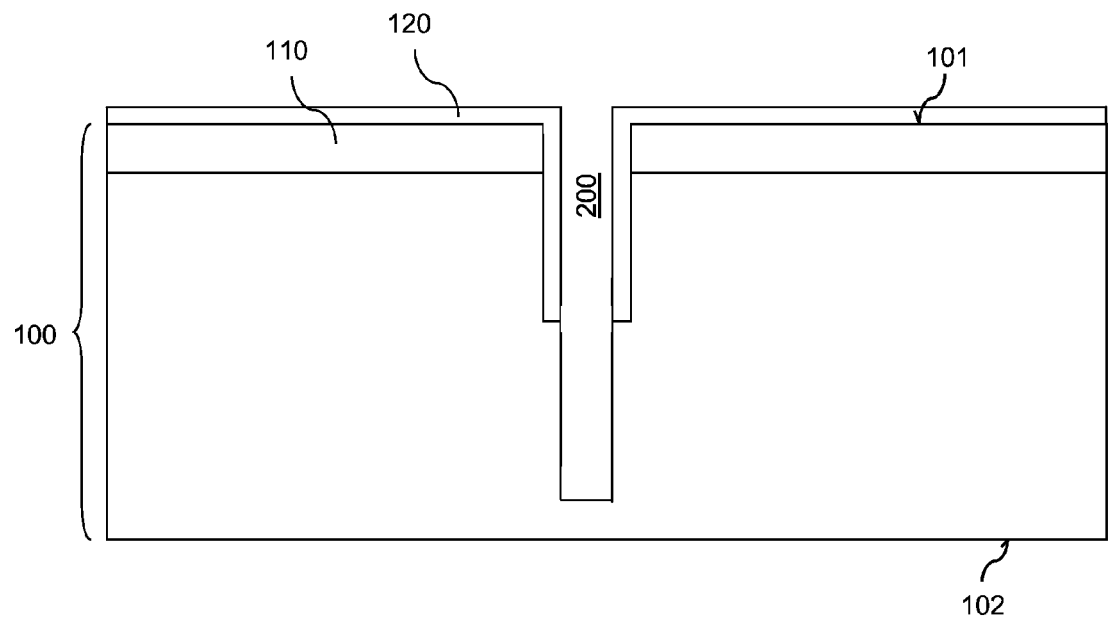

Referring to FIG. 2E, the trench 200 is etched deeper into the semiconductor body 100, so as to form a deeper trench. This deeper trench 200 may be formed by using a further anisotropic etching step, for example. The deeper trench 200 has an upper trench section, which is the trench section where the etch stop layer 120 covers the sidewalls, and a lower trench section, which is the trench section formed by extending the trench 200 deeper into the semiconductor body 100 and having sidewalls not covered not covered by the etch stop layer 120.

Figure 2F:
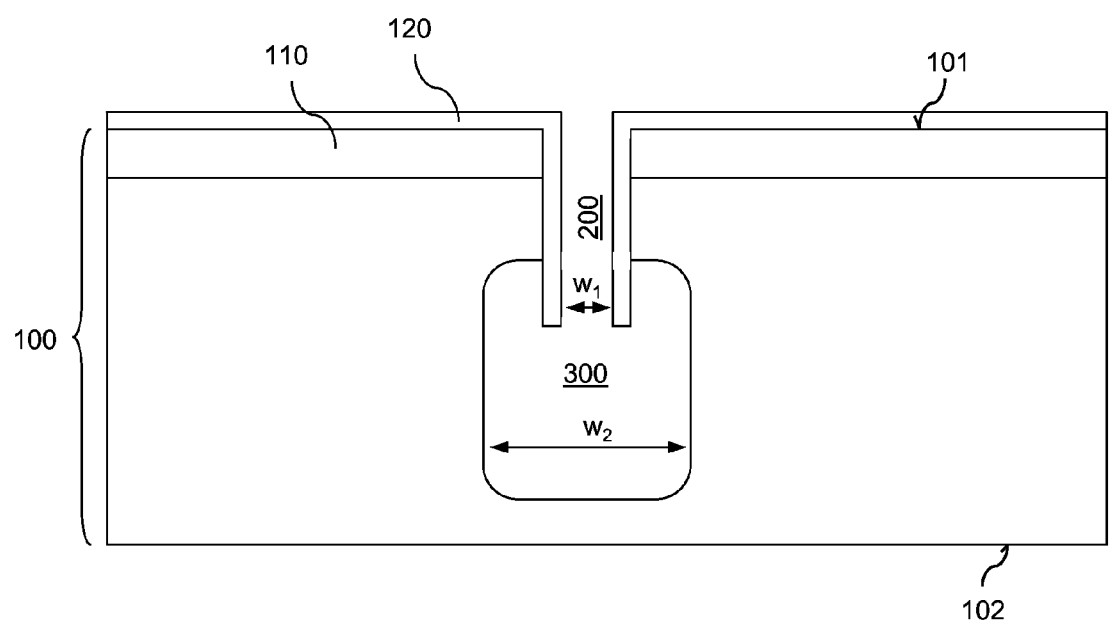

Referring to FIG. 2F, the void 300 is formed in the lower trench section. Forming the void 300 may include an isotropic etching step. Isotropic etching is a non-directional etching process, in which material is removed using an etchant. The etchant may be a liquid or a chemically active ionized gas, also known as plasma, for example. During this etching step, the lower trench section, which is not covered by the etch stop layer 120, is widened, resulting in the void 300. The void 300 has a width $w_2$ in a horizontal direction of the semiconductor body 100 that is greater than the width $w_1$ of the trench 200. The void 300 may extend deeper into the semiconductor body 100 than the trench 200. Further, by virtue of the isotropic etching, the void may also be formed adjacent a section of the upper trench section and separated from this trench section by a section of the etch stop layer 120. The etch stop layer 120 may be removed at a later stage of the process.

FIGS. 3A-3F show a method for forming an insulation structure in unprocessed regions of a semiconductor body 100. However, there may be applications in which devices or device structures have already been formed in a semiconductor body 100, before an insulation structure is formed.

Figure 3A:
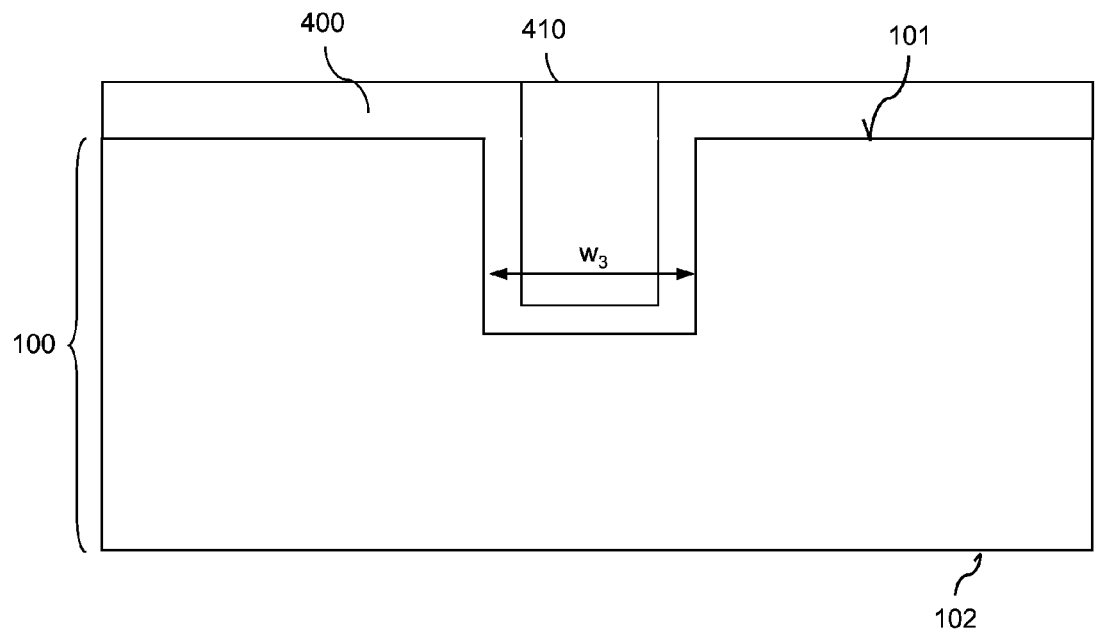
FIGS. 3A-3F illustrates vertical cross-sectional views of a semiconductor body that illustrate a further example of a method for producing an insulation structure.

FIG. 3A shows a vertical cross sectional view of a semiconductor body 100 in which a vertical (deep) trench has been formed. A dielectric layer 400 may line sidewalls and a bottom of the trench and may be arranged on the first surface 101 of the semiconductor body 100. The trench 410 lined with the dielectric layer 400 may be filled with a filling material 410, such as a polycrystalline semiconductor material, or the like.

Figure 3B:
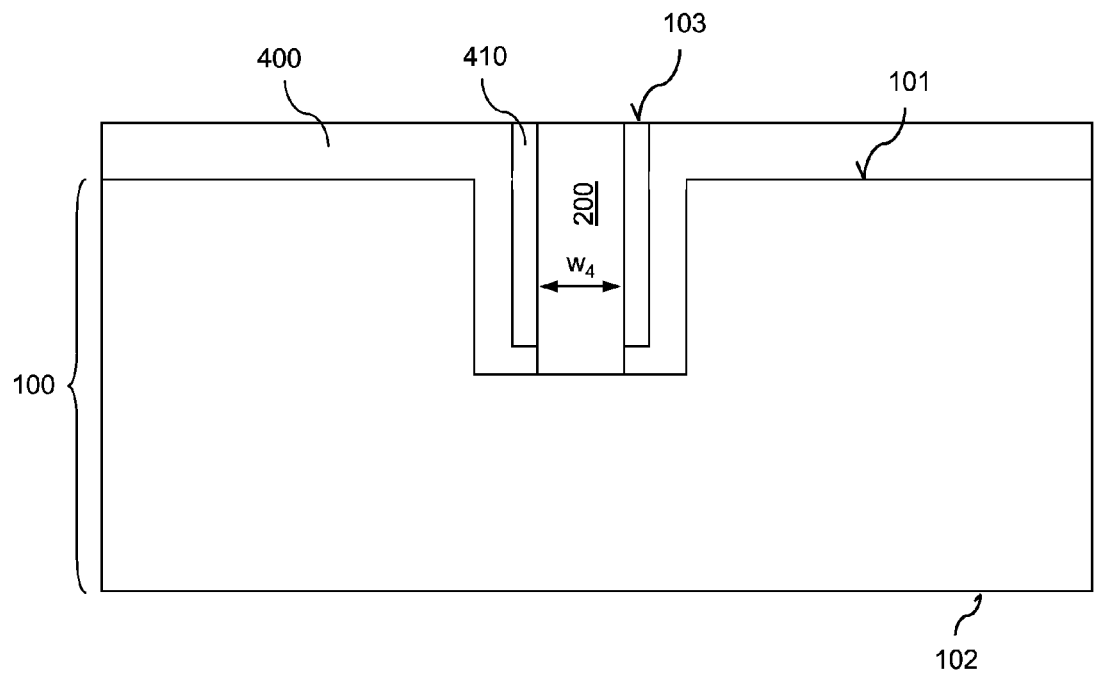

Based on the topology shown in FIG. 3A, an insulation structure may be formed in the same way as has been explained with reference to FIGS. 2A-2F. Referring to FIG. 3B, the trench 200 is formed in the deep trench 410 that is already in place. The trench 200 extends from a top surface 103 of the filling material 410 in a vertical direction into the deep trench. Forming the trench 200 may include an etching process. During the etching process, a top surface 103 of the dielectric layer 400 may be covered by an etch mask (not shown) which resists etching in areas, where no etching is desired. In the embodiment shown in FIG. 3B, the resulting trench 200 has a width $w_4$ in a vertical direction of the semiconductor body 100 that is smaller than the width $w_3$ of the deep trench 410.

Figure 3C:
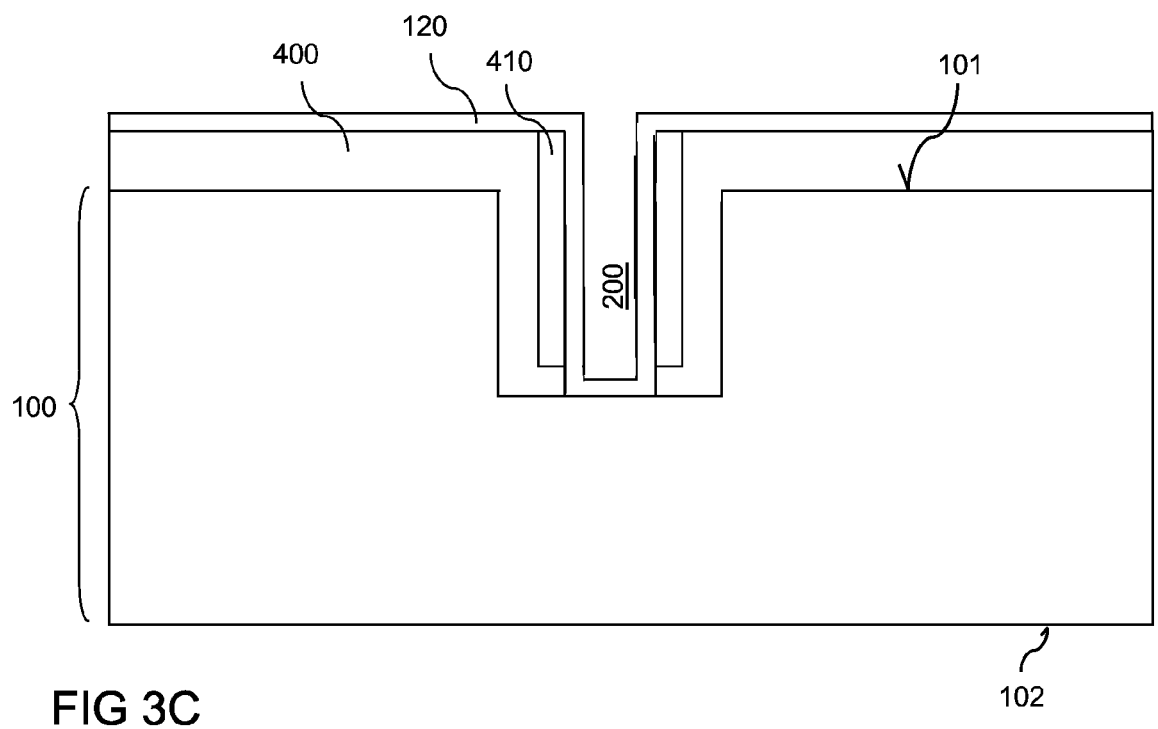
Figure 3D:
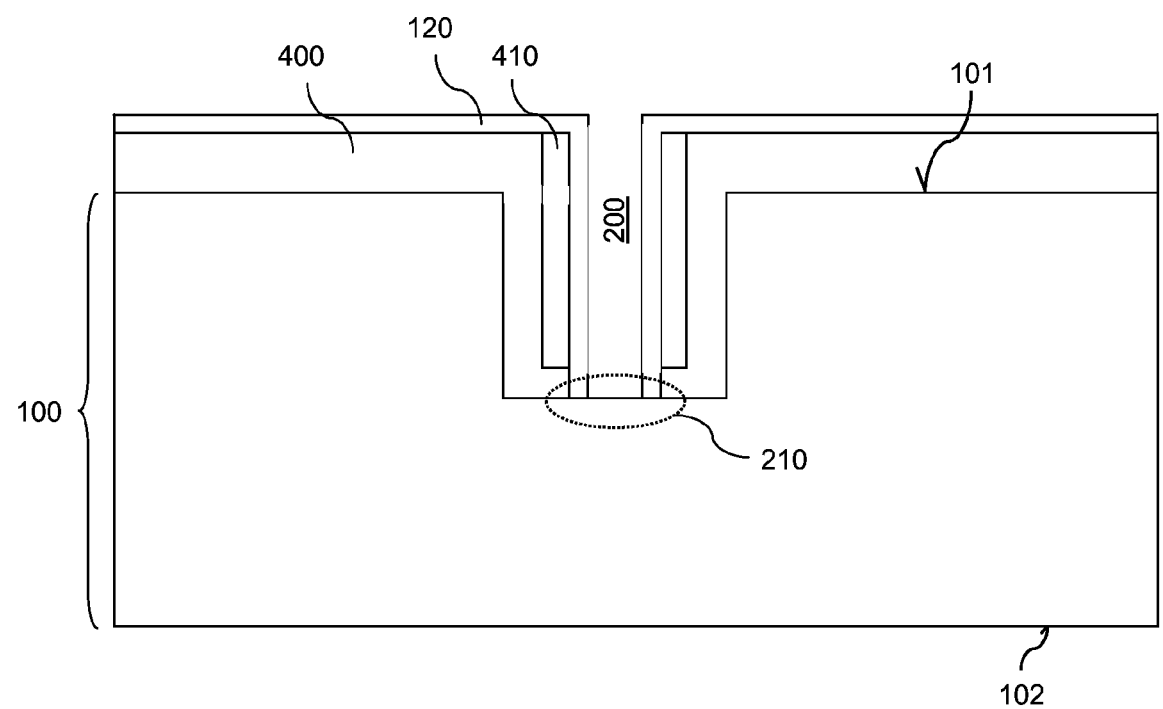

Referring to FIG. 3C, in a following step, the etch stop layer 120 may be formed in the trench 200 and on the top surface 103. Then, referring to FIG. 3D, an anisotropic etching process may be performed to etch the etch stop layer 120 at the bottom 210 of the trench 200.

Figure 3E:
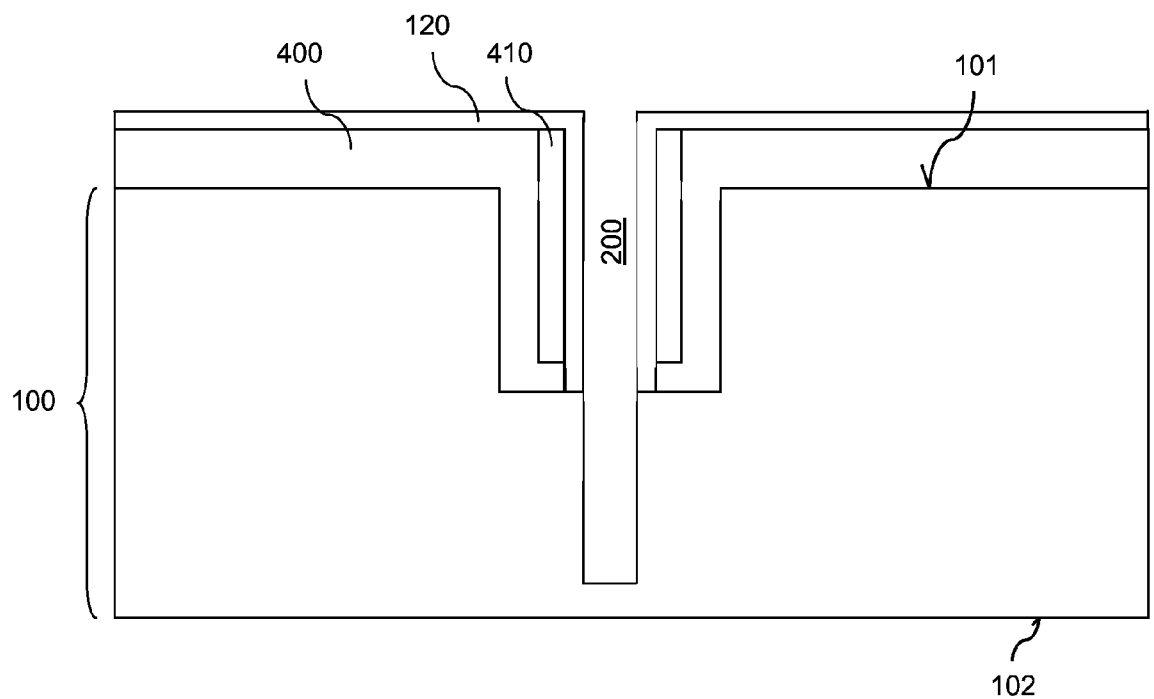
Figure 3F:
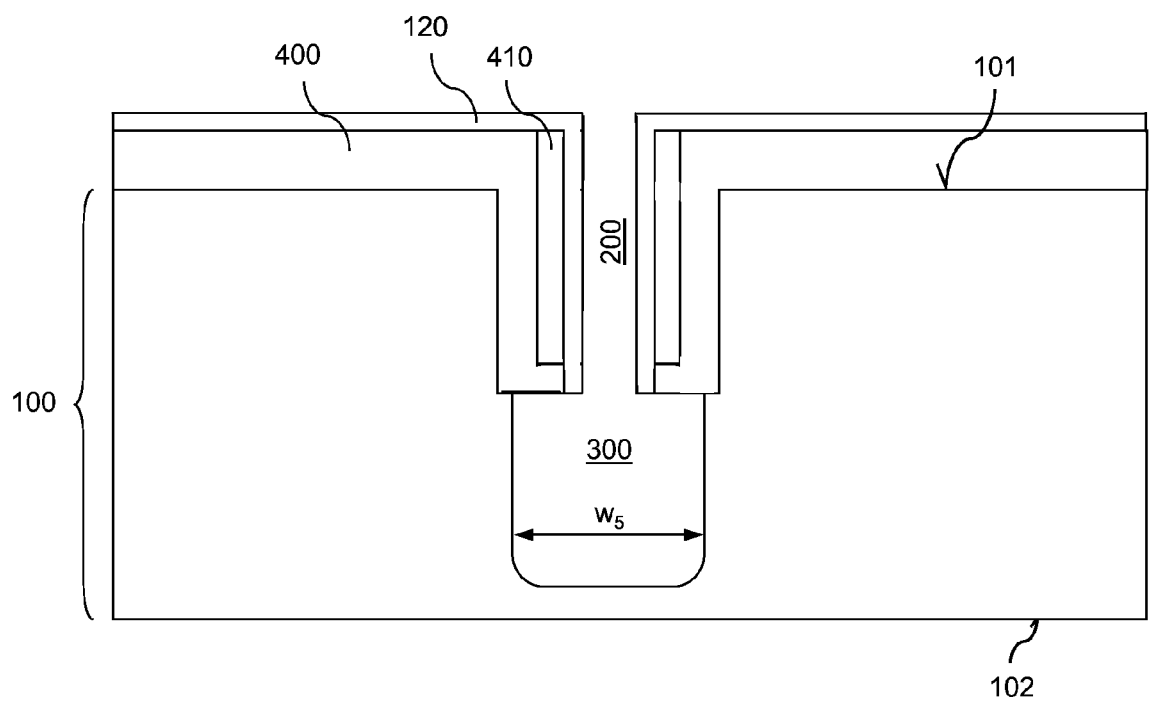

Referring to FIGS. 3E and 3F, the deeper trench 200 is formed (see FIG. 3E), and the void 300 is formed in the lower trench section of the deeper trench 200 (see FIG. 3F). The deeper trench 200 can be formed by using an anisotropic etching step, for example. The void 300 can be formed using an isotropic etching step, for example. During the isotropic etching step, the lower section of the trench 200, which is not covered by the etch stop layer 120, is widened, resulting in the void 300. The void 300 has a width w5 in a horizontal direction of the semiconductor body 100 that is greater than the width $w_1$ of the trench 200.

The width w5 of the void can be adjusted through a duration of the etching process, wherein the width increases as the duration of the etching process increases. For example, the duration is set such that the resulting void 300 has a width $_{w5}$ that is smaller than the width $w_3$ of the deep trench 410. This is shown in FIG. 3F.

Figure 4:
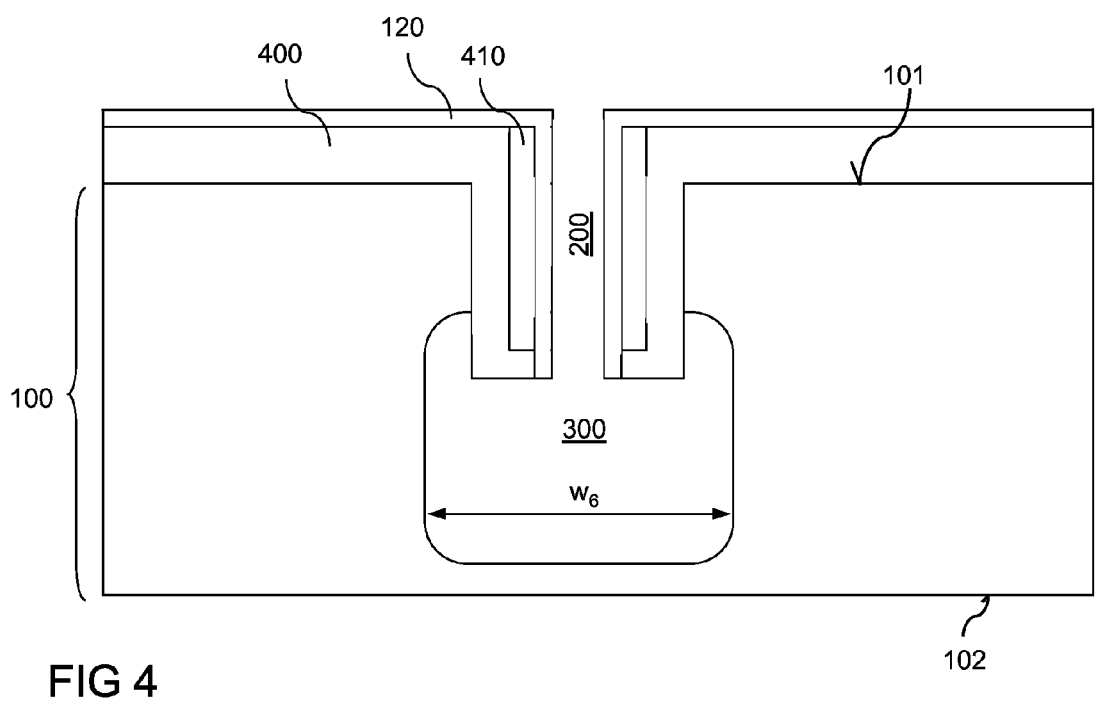
FIG. 4 illustrates a vertical cross-sectional view of a semiconductor body that illustrates a further example of a method for producing an insulation structure.

However, referring to FIG. 4, it is also possible, to set the duration of the etching such that the resulting void 300 has a width $w_6$ that is greater than the width $w_3$ of the deep trench 410.

In the embodiments explained with reference to FIGS. 2-4, the trench 200 of the insulation structure is formed before forming the void 300. It is, however, also possible to form the void 300 in the semiconductor body 100 before forming the trench 200. An embodiment of such a method is explained with reference to FIGS. 5A-5D below. These figures each show a vertical cross sectional view of the semiconductor body 100.

Figure 5A:
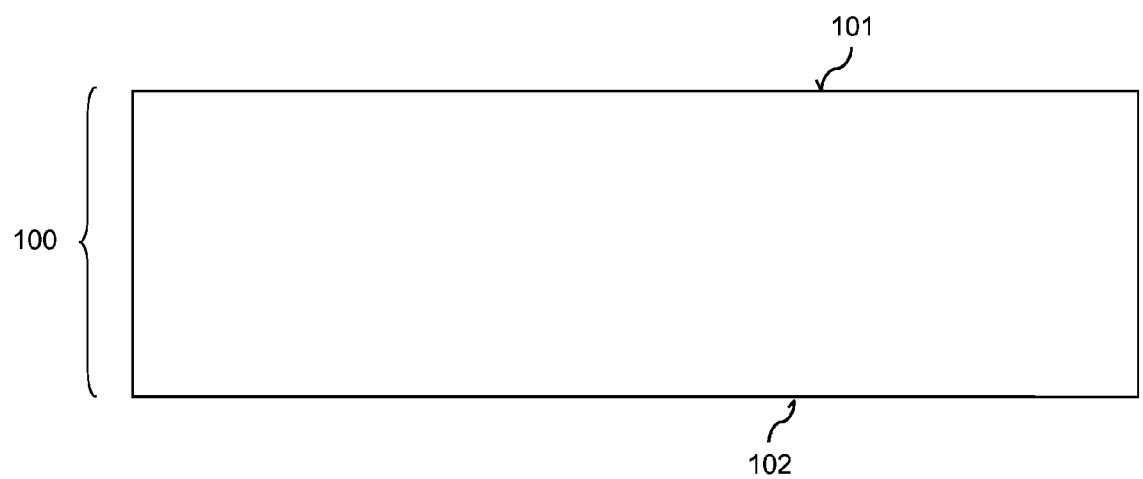
FIGS. 5A-5D illustrates vertical cross-sectional planes of a semiconductor body that illustrate a further example of a method for producing an insulation structure.
Figure 5B:
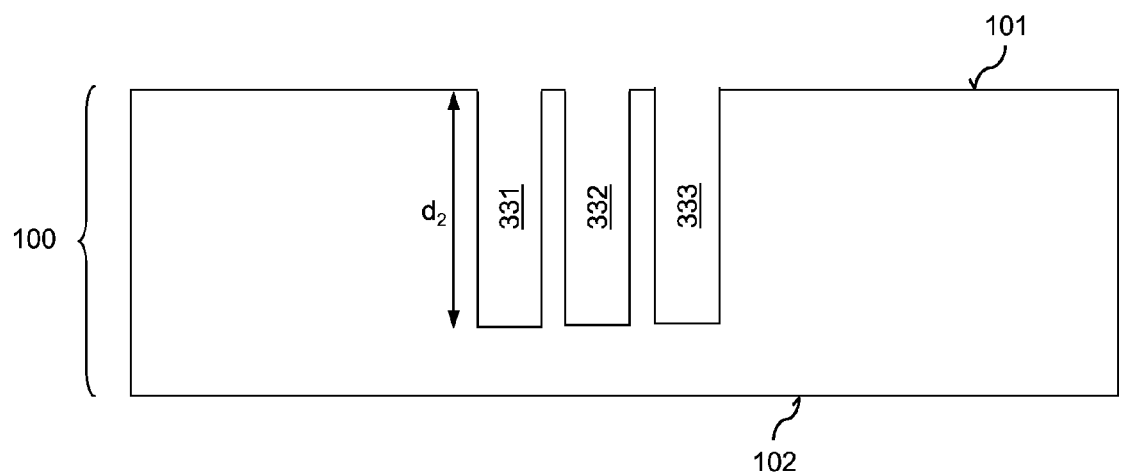
Figure 5C:
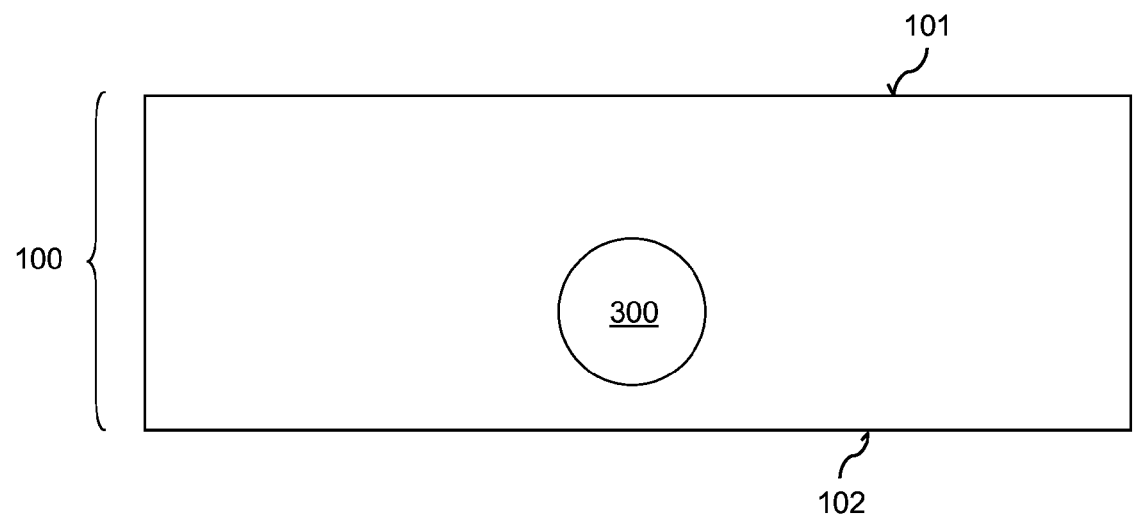

Referring to FIGS. 5A and 5C, the method includes providing the semiconductor body 100 having the first surface 101, and the second surface 102 (see FIG. 5A) opposite to the first surface 101, and forming the void 300 spaced apart from the first surface 101 in the semiconductor body 100 (see FIG. 5C). Forming the void 300 may involve a method known as Venezia-process. In this method, referring to FIG. 5B, several trenches 331, 332, 333 are formed in the semiconductor body 100 (FIG. 5B). Each of these trenches 331, 332, 333 extends in a vertical direction from the first surface 101 into the semiconductor body 100. The trenches 331, 332, 333 can be formed using a conventional trench forming technique, such as an anisotropic etching process, and can be formed with substantially identical trench depths $d_1$. In FIG. 5B three trenches 331, 332, 333 are shown. This is, however, only an example. Any number of trenches 331, 332, 333 may be formed, depending on the desired size of the resulting void 300.

The semiconductor body 100 is then tempered in a hydrogen atmosphere, so as to form the void 300 from the plurality of trenches 331, 332, 333. It is known, that by tempering a semiconductor body 100 in a pure hydrogen atmosphere at a relatively high temperature, defects can be eliminated. The temperature is, for example, higher than 1000° C. such as between about 1100° C. and 1150° C. Performing such tempering process after forming the trenches 331, 332, 333 results in a buried void 300 having smooth sidewalls. The void 300 may have a rounded shape, for example. This is, however, only an example. Depending on the size and shape of the trenches 331, 332, 333 the void 300 may have any other shape, such as a rectangular or almost rectangular shape, for example.

Figure 5D:
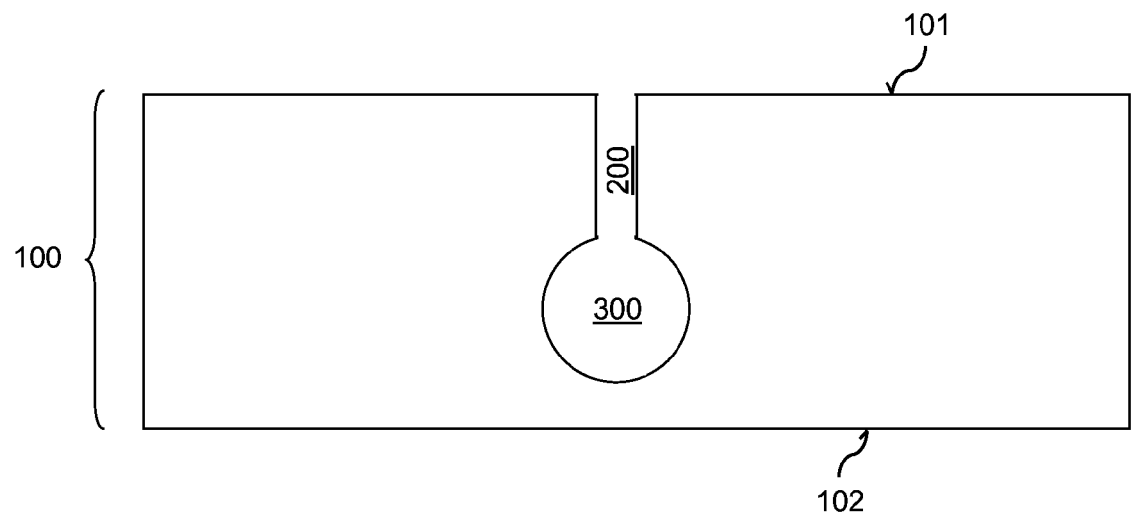

Referring to FIG. 5D, the trench 200 is formed such that it extends from the first surface 101 to the buried void 300. The trench 200 may be formed using an anisotropic etching process, for example.

The insulation structure including the trench 200 and the void 300 may be sealed and partially or completely filled with a dielectric layer. One embodiment of a method for sealing the insulation structure is explained with reference to FIGS. 6A-6G below.

Figure 6A:
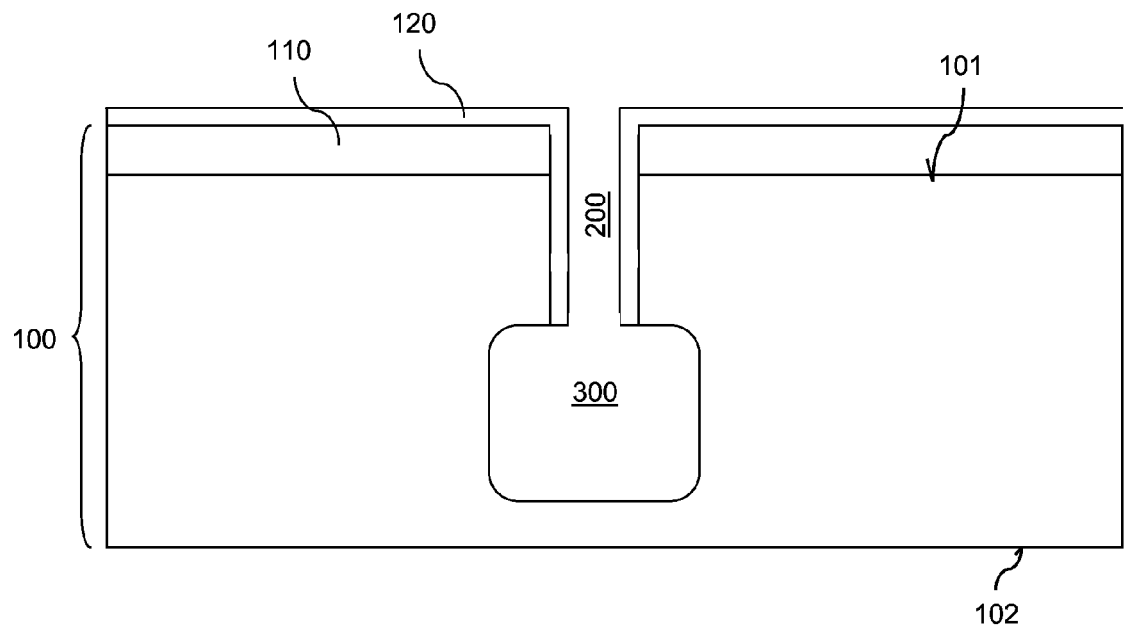
FIGS. 6A-6G illustrate vertical cross-sectional views of a semiconductor body that illustrate an example of a method for producing a partially filled or completely filled insulation structure.

FIG. 6A shows a vertical cross sectional view of the semiconductor body 100 after forming the trench 200 and the void 300 and after first method steps for sealing the insulation structure. The trench 200 and the void 300 can be formed using one of the methods explained herein before. The first method steps for sealing the insulation structure may include forming a protection layer on the first surface 101 and in the trench 200 above the void. Referring to FIG. 6A, this protection layer 110 may include the mask 110 and the etch stop layer 120 explained with reference to FIGS. 2-4. However, it is also possible to remove the etch stop layer 120 before performing the method steps explained herein below.

Figure 6B:
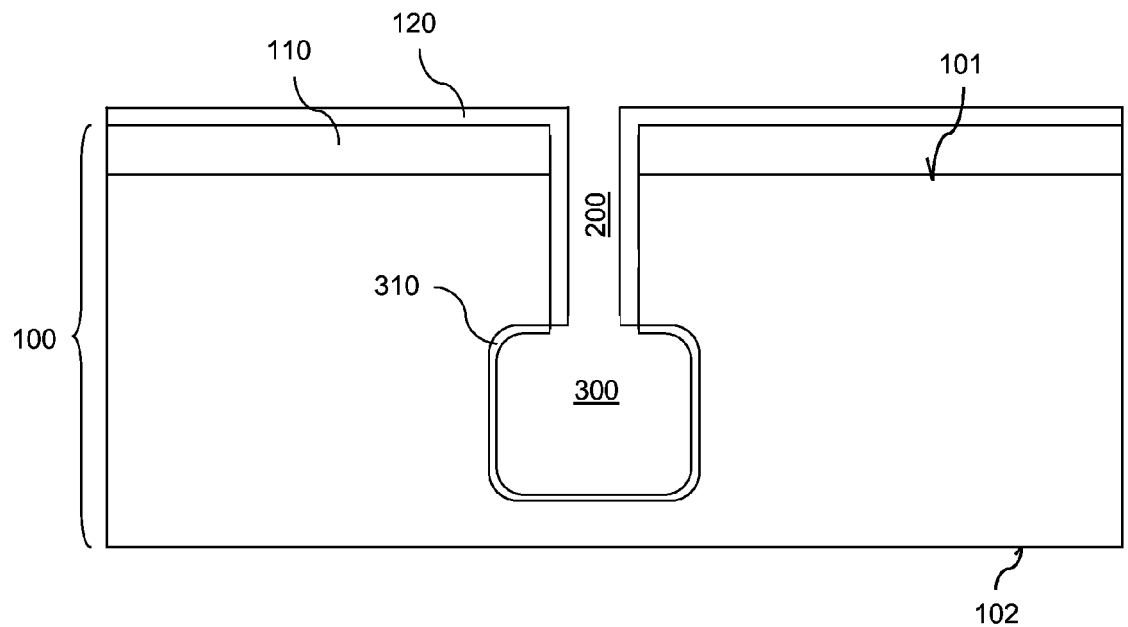

Referring to FIG. 6B, a dielectric layer 310 is formed on the sidewalls of the void 300 (and on the sidewalls of the trench 120 if the etch stop layer 120 has been removed). The dielectric layer 310 may include an oxide formed by thermal oxidation, for example.

Figure 6C:
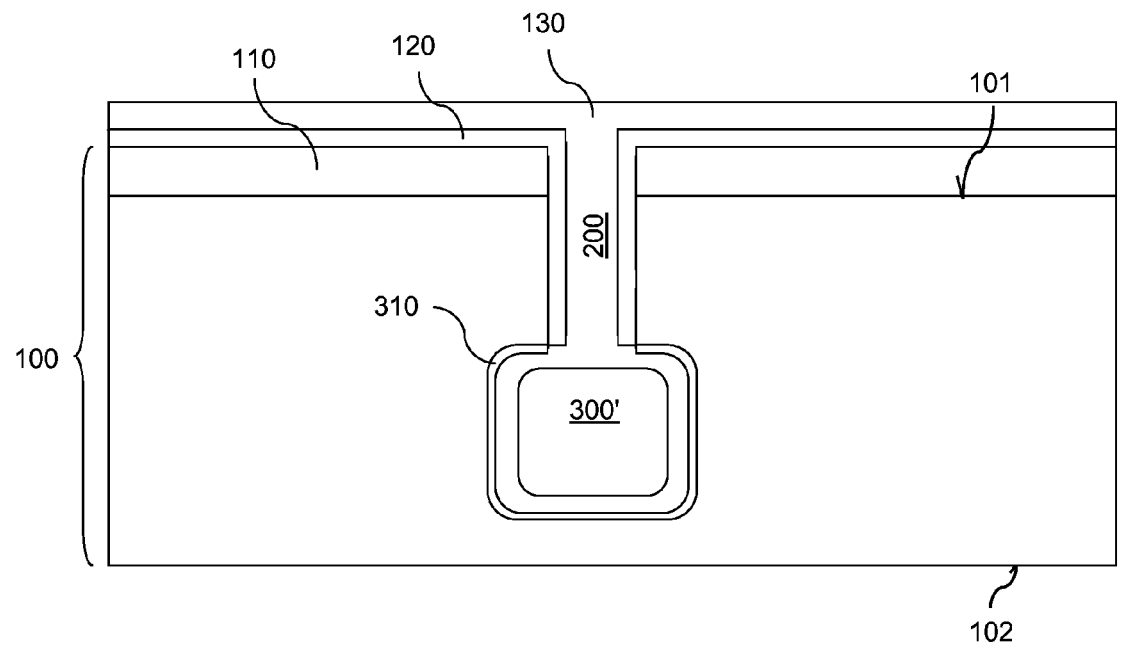

Referring to FIG. 6C, the trench 200 is filled with a further dielectric layer 130. This further dielectric layer 130 is an oxide layer, for example. Forming this further dielectric layer 130 may include a deposition process, such as an LPCVD (Low Pressure Chemical Vapour Deposition Process). The further dielectric layer 130 may be formed such that it covers at least parts of the protection layer (the mask layer 110) above the first surface 101. The further dielectric layer 130 may further cover the surfaces of the void 300. Dependent on the width of the void 300, a residual void 300' may remain after forming the further dielectric layer 130. This is, because the trench 200 might be completely filled with further dielectric material 130 before the void 300 is completely filled.

However, there may be applications where it is desirable to completely fill the void 300 with a dielectric material. Method steps that completely fill the residual void 300' are explained with reference to FIGS. 6D-6G below.

Figure 6D:
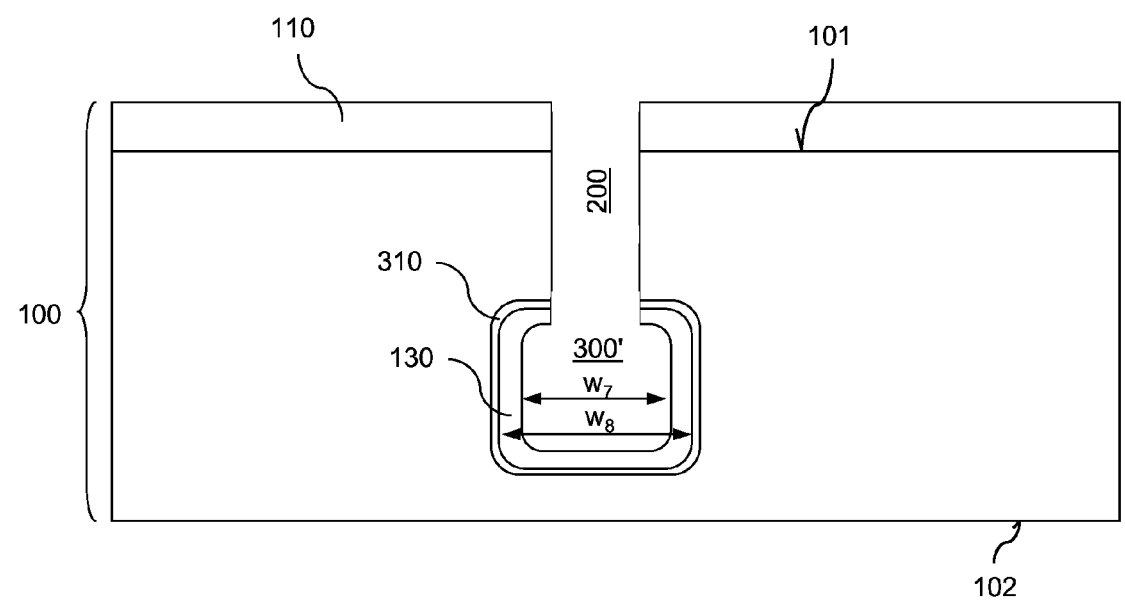

Referring to FIG. 6D, the dielectric layer 130 (as well as the etch stop layer 120, if still present) is removed at least from the vertical sidewalls of the trench 200, so as to open the residual void 300'. However, the dielectric layer 130 remains on the sidewalls of the residual void 300. Removing the dielectric layer 130 from the sidewalls of the trench 200 and leaving the dielectric layer 130 on the sidewalls of the residual void 300' may include an anisotropic etching process, for example. In this process, the dielectric layer 130 may be removed from the mask layer 110 as well. As the dielectric layer 130 is not removed from the sidewalls of the residual void 300', a width $w_7$ of the residual void 300' is smaller than its original width $w_2$. In this process, the etch stop layer 120 protects the sidewalls of the trench 200 from being etched.

Figure 6E:
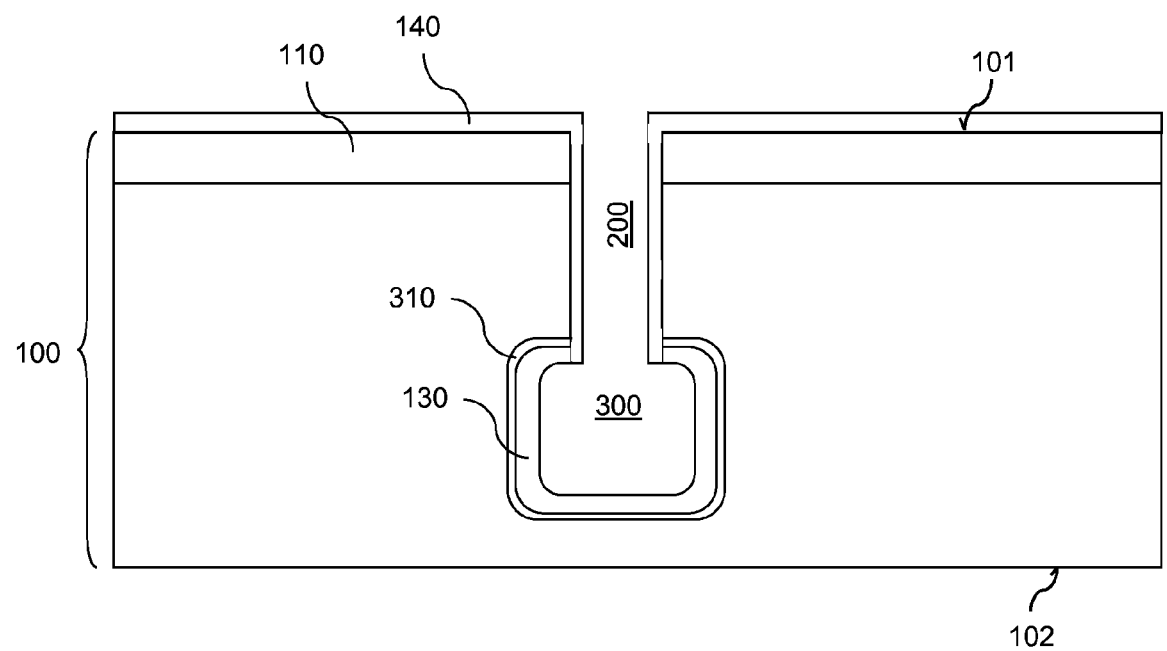
Figure 6F:
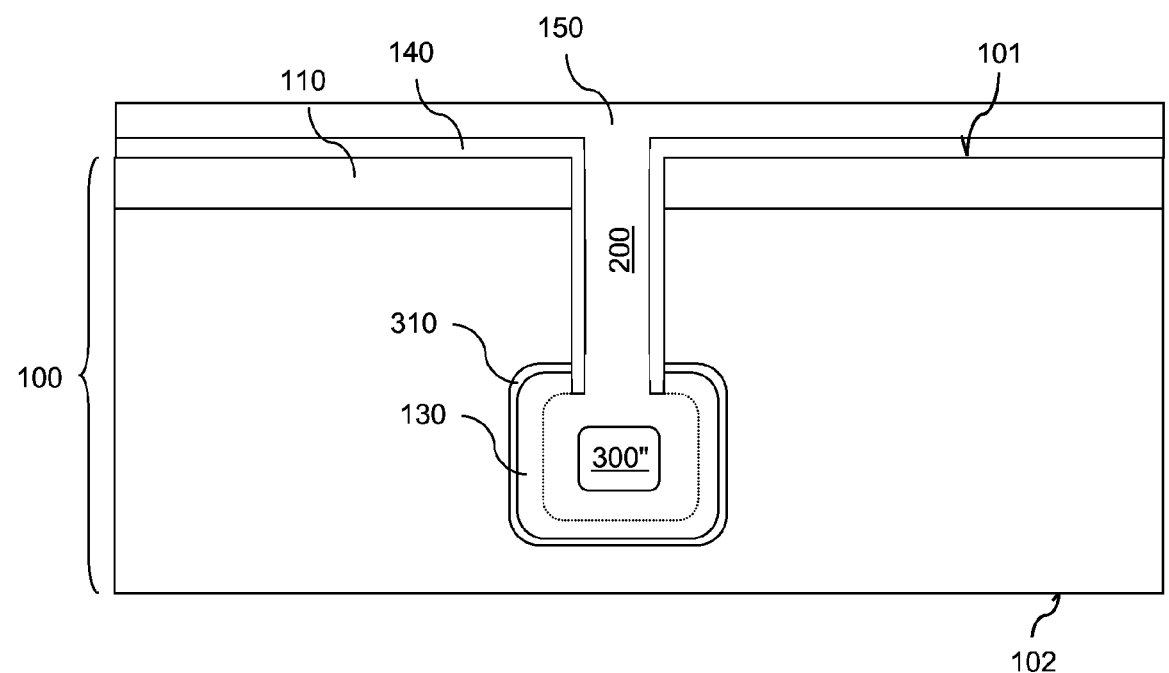

Referring to FIG. 6E, another dielectric layer 140 such as an oxide layer or a nitride layer is formed at least on the vertical sidewalls of the trench 200. This dielectric layer 140 is optional and may include at least one of an oxide and a nitride, for example. The oxide may be a thermally grown oxide. After forming the dielectric layer 140, the insulation structure may again be sealed with a dielectric layer 150 (see FIG. 6F). This dielectric layer 150 may be an oxide layer formed by an LPCVD process. The dielectric layer 150 covers the surfaces of the residual void 300' as well as the surfaces of the trench 200, and may completely fill the trench 200. Depending on the size of the void 300, and the residual void 300', the dielectric layer 150 may completely fill the residual void 300'. Another residual void 300'' may, however, still be present within the semiconductor body 100, as is shown in FIG. 6F.

Figure 6G:
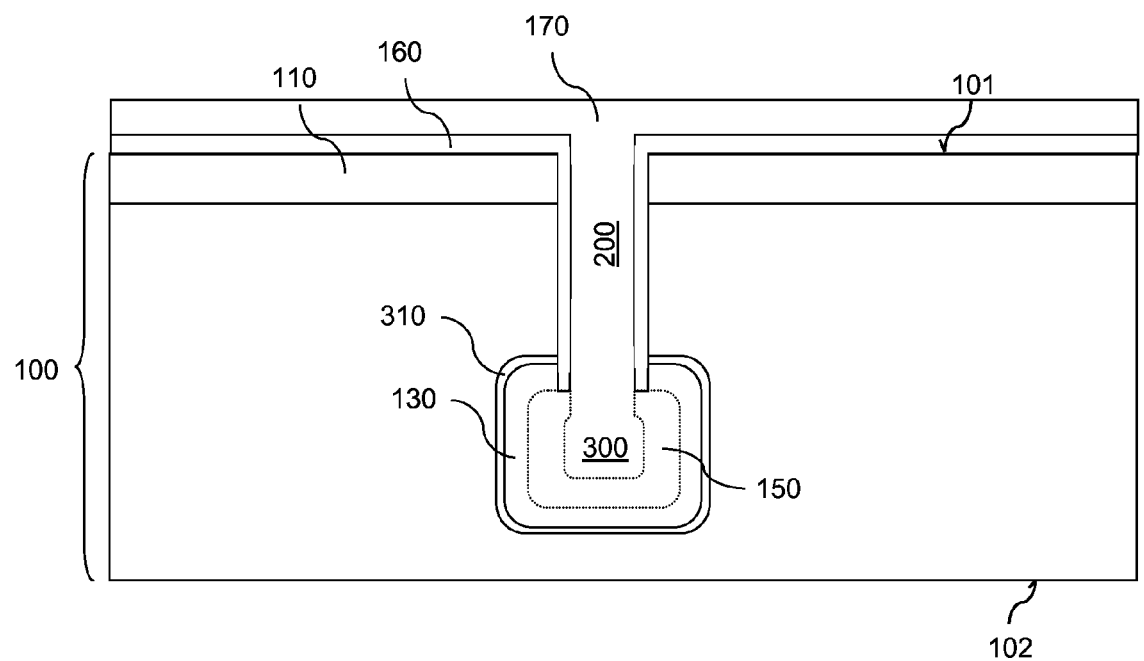

If there is still a void 300'', the steps explained with reference to FIGS. 6D-6F may be repeated. These steps may be repeated until the void 300 and therefore the insulation structure is completely filled as illustrated in FIG. 6G.

An example of an application in which the insulation structure explained herein before can be used is explained with reference to FIGS. 7 and 8.

Figure 7:
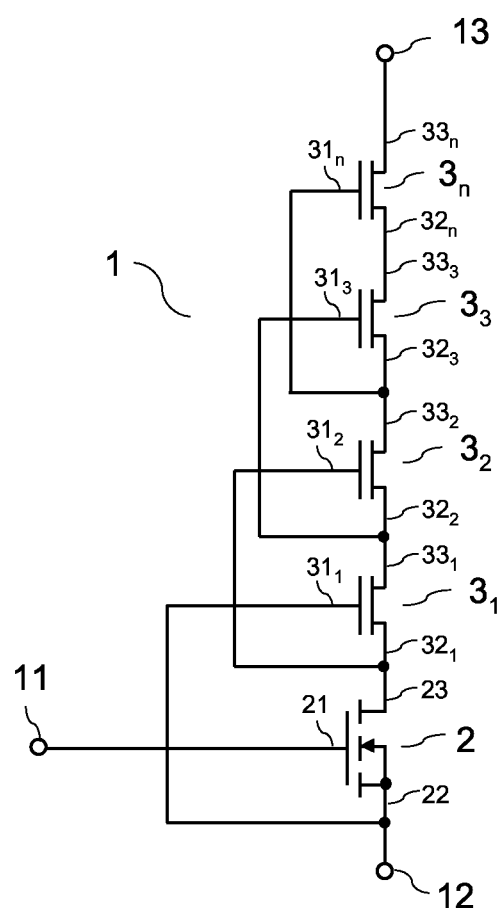
FIG. 7 illustrates one embodiment of a transistor arrangement.

FIG. 7 illustrates a first embodiment of a semiconductor arrangement 1 that includes a first semiconductor device 2 and a plurality of second semiconductor devices $3_1$-$3_n$. The first semiconductor device 2 has a load path between a first load terminal 22 and a second load terminal 23 and can assume an on-state, in which the load path conducts a current, or an off-state, in which the load paths blocks. The first semiconductor device 2 according to FIG. 1 is implemented as a transistor and further includes a control terminal 21. Specifically, the first semiconductor device according to FIG. 7 is implemented as a MOSFET where the control terminal 21 is a gate terminal and the first and second 22, 23 load terminals are source and drain terminals, respectively.

In FIG. 7 as well as in the following figures reference number "3" followed by a subscript index denotes the individual second semiconductor devices. Same parts of the individual second semiconductor devices, such as control terminals and load terminals, have the same reference character followed by an subscript index. For example, $3_1$ denotes a first one of the second semiconductor devices that has a control terminal $31_1$ and first and second load terminals $32_1$, $33_1$. In the following, when reference is made to an arbitrary one of the second semiconductor devices or to the plurality of the second semiconductor devices, and when no differentiation between individual second semiconductor devices is required, reference numbers 3, 31, 32, 33 without indices will be used to denote the second semiconductor devices and their individual parts.

The second semiconductor devices 3 are implemented as transistors in the embodiment illustrated in FIG. 7 and will be referred to as second transistors in the following. Each of the second transistors 3 has a control terminal 31 and a load path between a first load terminal 32 and a second load terminal 33. The load paths 32-33 of the second semiconductor devices are connected in series with each other so that the first load terminal of one second transistor is connected to the second load terminal of an adjacent second transistor. Further, the load paths of the second transistors 3 are connected in series with the load path 22-23 of the first semiconductor device 2, so that the first semiconductor device 1 and the plurality of second transistors 3 form a cascode-like circuit.

Referring to FIG. 7, there are n second transistors 3, with n>1. From these n second transistors 3, a first second transistors $3_1$ is the second transistor that is arranged closest to first semiconductor device 2 in the series circuit with the n second transistors 3 and has its load path $32_1$-$33_1$ directly connected to the load path 22-23 of the first semiconductor device 2. An n-th second transistors $3_n$ is the second transistor that is arranged most distant to first semiconductor device 2 in the series circuit with the n second transistors 3. In the embodiment illustrated in FIG. 7, there are n=4 second transistors 3. However, this is only an example, the number n of second transistors 3 can be selected arbitrarily, namely dependent on a desired voltage blocking capability of the semiconductor device arrangement. This is explained in greater detail herein below.

Each of the second semiconductor devices 3 has its control terminal 31 connected to one of the load terminals of another one of the second semiconductor devices 3 or to one of the load terminals of the first semiconductor device 2, so that each of the second transistors $3_1$-$3_n$ receives as a control voltage a load path voltage of another one of the second semiconductor devices $3_1$-$3_n$, or the first semiconductor device 2, respectively.

In the embodiment illustrated in FIG. 7, the 1st second transistor $3_1$ has its control terminal $31_1$ connected to the first load terminal 22 of the first semiconductor device 2. Each of the other second transistors $3_2$-$3_n$ have their control terminal $31_2$-$31_n$ connected to the first load terminal $32_1$-$32_{n-1}$ of the second transistor that is adjacent in the series circuit in the direction of the first semiconductor device 2. Assume, for explanation purposes, that $3_i$ is one of the second transistors $3_2$-$3_n$ other than the first transistor $3_1$. In this case, the control terminal $31_i$ of this second transistor (upper second transistor) $3_i$ is connected to the first load terminal $32_{i-1}$ of an adjacent second transistor (lower second transistor) $3_{i-1}$. The first load terminal $32_{i-1}$ to which the control terminal $31_i$ of the upper second transistor $3_i$ is connected to is not directly connected to one of the load terminals $23_i$, $33_i$ of this upper second transistor $3_i$. According to a further embodiment (not illustrated), a control terminal $31_i$ of one second transistor $3_i$ is not connected to the first load terminal $31_{i-1}$ of that second transistor $3_{i-1}$ that is directly connected to the second transistor $3_i$, but is connected to the load terminal $32_{i-k}$ of a second transistor $3_{i-k}$, with k>1, farther away from the transistor. If, for example, k=2, then the control terminal $31_i$ of the second transistor $3_i$ is connected to the first load terminal $32_{i-2}$ of the second transistor $3_{i-2}$ that is two second transistors away from the second transistor $3_i$ in the direction of the first semiconductor device in the series circuit.

Referring to FIG. 7, the first semiconductor device 2 and the second transistors 3 can be implemented as MOSFETs. Each of these MOSFETs has a gate terminal as a control terminal 21, 31, a source terminal as a first load terminal, and a drain terminal as a second load terminal 22, 32. MOSFETs are voltage controlled devices that can be controlled by the voltage applied between the gate and source terminals (the control terminal and the first load terminal). Thus, in the arrangement illustrated in FIG. 7, the 1st second transistors $3_1$ is controlled through a voltage that corresponds to the load path voltage of the first semiconductor device 2, and the other second transistors $3_i$ are controlled through the load path voltage of at least one second transistor $3_{i-1}$ or $3_{i-2}$. The "load path" voltage of one MOSFET is the voltage between the first and second load terminal (drain and source terminal) of this MOSFET.

In the embodiment illustrated in FIG. 7, the first semiconductor device 2 is a normally-off (enhancement) transistor, while the second transistors 3 are normally-on (depletion) transistors. However, this is only an example. Each of the first semiconductor device 2 and the second transistors 3 can be implemented as a normally-on transistor or as a normally-off transistor. The individual transistors can be implemented as n-type transistors or as p-type transistors.

Implementing the first semiconductor device 2 and the second transistors 3 as MOSFETs is only an example. Any type of transistor can be used to implement the first semiconductor device 2 and the second transistors 3, such as a MOSFET, a MISFET, a MESFET, an IGBT, a JFET, a FINFET, a nanotube device, an HEMT, etc. Independent of the type of device used to implement the first semiconductor device 2 and the second semiconductor devices 3, these devices are connected such that each of the second transistors 3 is controlled by the load path voltage of at least one other second transistor 3 or the first semiconductor device 2 in the series circuit.

The semiconductor device arrangement with the first semiconductor device 2, implemented as transistor, and the second transistors 3 can be switched on and off like a conventional transistor by applying a suitable drive voltage to the first semiconductor device 2. The control terminal 21 of the first semiconductor device 2 forms a control terminal 11 of the overall arrangement, and the first load terminal 21 of the first semiconductor device 2 and the second load terminal of the n-th second transistor $3_n$ form the first and second load terminals 12, 13, respectively, of the overall arrangement.

Figure 8:
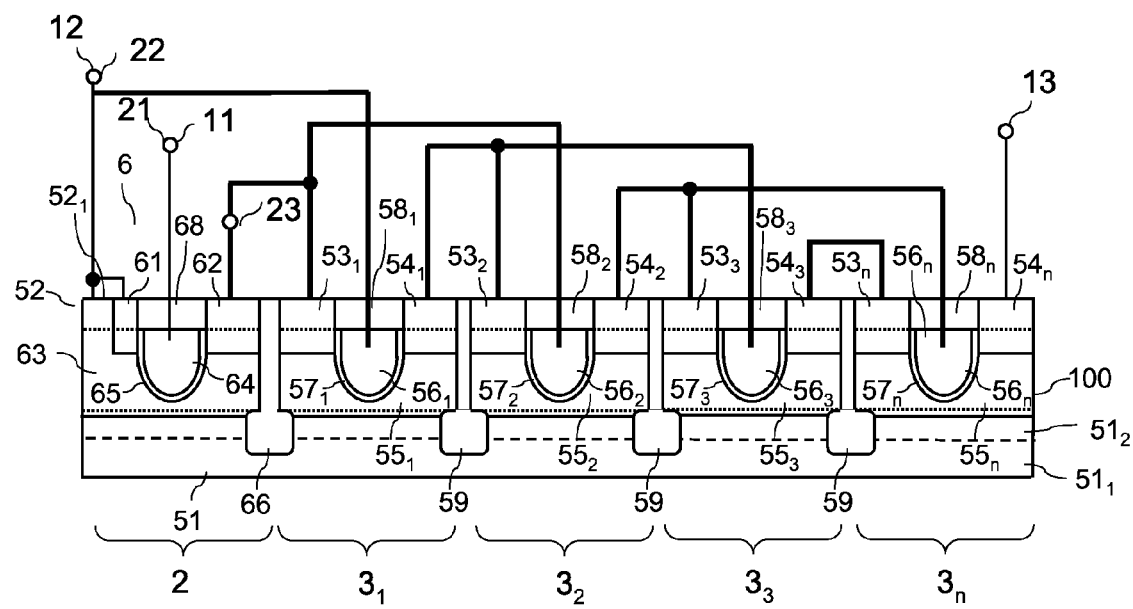
FIG. 8 illustrates one embodiment of integrating the transistor arrangement shown in FIG. 7 in a semiconductor body.

FIG. 8 illustrates a vertical cross sectional view of a semiconductor body 100 in which the individual devices of the semiconductor arrangement shown in FIG. 7 are implemented. In this embodiment, the first transistor 2, and the second transistors $3_1$-$3_n$ are implemented as FINFETs. FIG. 8 illustrates a vertical cross sectional view of a semiconductor fin 52 in which active regions (source, drain and body regions) of a first semiconductor device 2 and of n second transistors 3 are arranged. The individual FINFETs can be implemented in different ways. Two different embodiments are explained with reference to FIGS. 9A-9C and 10A-10C below.

Figures 9A, 9B, 9C:
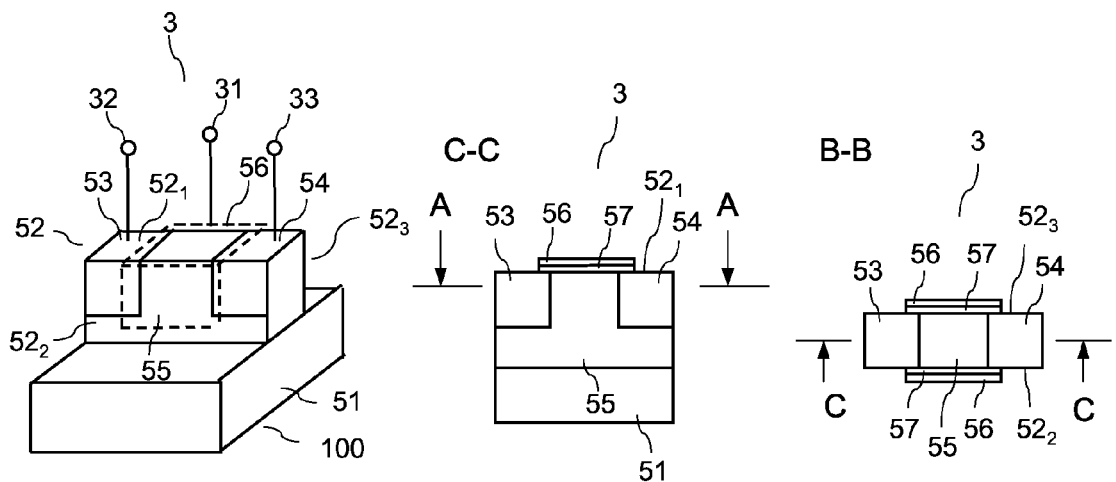
FIGS. 9A-9C illustrate one embodiment of a FINFET.

FIGS. 9A-9C show in greater detail one embodiment of a second transistor 3 implemented as a FINFET. FIG. 9A shows a perspective view of one second transistor 3. FIG. 9B shows a vertical cross sectional view and FIG. 9C shows a horizontal cross sectional view of this second transistor 3. FIGS. 9A, 9B, and 9C only show that section of the semiconductor body in which the second transistor 3 is implemented. Active regions of the first semiconductor device 2 and active regions of neighbouring second transistors are not shown. The second transistor 3 according to FIGS. 9A to 9C is implemented as a MOSFET, and includes a source region 53, a drain region 54 and a body region 55 that are each arranged in a fin-like semiconductor section 52, which will also be referred to as "semiconductor fin" in the following. The semiconductor fin is arranged on a substrate 51. In a first horizontal direction, the source and drain regions 53, 54 extend from a first sidewall $52_2$ to a second sidewall $52_3$ of the semiconductor fin 52. In a second direction perpendicular to the first direction the source and drain regions 53, 54 are distant from one another and are separated by the body region 55. The gate electrode 56 (illustrated in dashed lines in FIG. 9A) is dielectrically insulated from the semiconductor fin 52 by a gate dielectric 57 and is adjacent to the body region 55 on the sidewalls $52_2$, $52_3$ and on a top surface $52_1$ of semiconductor fin 52.

Figures 10A, 10B, 10C:
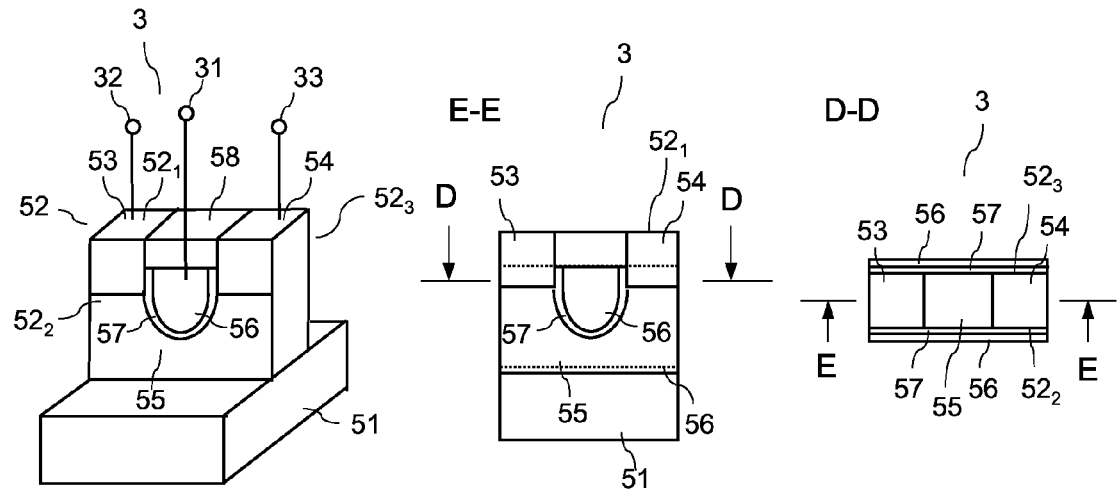
FIGS. 10A-10C illustrate another embodiment of a FINFET.

FIGS. 10A to 10C illustrate a further embodiment of one second transistor 3 implemented as a FINFET. FIG. 10A shows a perspective view, FIG. 10B shows a vertical cross sectional view in a vertical section plane E-E, and FIG. 10C shows a horizontal cross sectional view in horizontal section plane D-D. The vertical section plane E-E extends perpendicular to the top surface $52_1$ of the semiconductor fin 52 and in a longitudinal direction of the semiconductor fin 52. The horizontal section plane D-D extends parallel to the top surface $52_1$ of the semiconductor fin. The "longitudinal direction" of the semiconductor fin 52 corresponds to the second horizontal direction and is the direction in which the source and drain region 53, 54 are distant from one another.

The transistor 3 shown FIGS. 10A to 10C is implemented as a U-shape-surround-gate-FINFET. In this transistor, the source region 53 and the drain region 54 extend from the first sidewall $52_2$ to the second sidewall $52_3$ of the semiconductor fin 52 in the first horizontal direction, and are distant from one another in the second horizontal direction (the longitudinal direction of the semiconductor fin 52) that is perpendicular to the first horizontal direction. Referring to FIGS. 10A and 10B, the source region 53 and the drain region 54 are separated by a trench which extends into the body region 55 from the top surface $52_1$ of the semiconductor fin and which extends from sidewall $52_2$ to sidewall $52_3$ in the first horizontal direction. The body region 55 is arranged below the source region 53, the drain region 54 and the trench in the semiconductor fin 52. The gate electrode 56 is adjacent to the body region 55 in the trench and along the sidewalls $52_2$, $52_3$ of the semiconductor fin 52 and is dielectrically insulated from the body region 55 and the source and drain regions 53, 54 by the gate dielectric 57. In an upper region of the trench, which is a region in which the gate electrode 56 is not arranged adjacent to the body region 55, the gate electrode 56 can be covered with an insulating or dielectric material 58.

The second transistors of FIGS. 9A to 9C and of FIGS. 10A to 10C are, for example, implemented as depletion transistors, such as n-type or p-type depletion transistors. In this case, the source and drain regions 53, 54 and the body region 55 have the same doping type. The body region 55 usually has a lower doping concentration than the source and drain regions 53, 54. The doping concentration of the body region 55 is, e.g., about $2E18$ cm$^{-3}$. In order to be able to completely interrupt a conducting channel in the body region 55 between the source region 53 and the drain region 54, the gate electrode 56 along the sidewalls $52_2$, $52_3$ of the semiconductor fin 52 completely extends along the semiconductor fin 52 in the second horizontal direction (the longitudinal direction). In the vertical direction the gate electrode 56 along the sidewalls $52_2$, $52_3$ extends from the source and drain regions 53, 54 to at least below the trench.

Referring to FIGS. 9A and 10A, the source region 53 is connected to the first load terminal (source terminal) 32, the drain region 54 is connected to the second load terminal (drain terminal) 33, and the gate electrode 56 is connected to the control terminal (gate terminal) 31. These terminals are only schematically illustrated in FIGS. 9A and 10A.

A thickness of the semiconductor fin 52, which is the dimension of the semiconductor fin in the first horizontal direction, and the doping concentration of the body region 55 are adjusted such that a depletion region controlled by the gate electrode 56 can extend from sidewall $52_2$ to sidewall $52_3$ in order to completely interrupt a conducting channel between the source and the drain region 53, 54 and to switch the second transistor 3 off. In an n-type depletion MOSFET a depletion region expands in the body region 55 when a negative control (drive) voltage is applied between the gate electrode 56 and the source region 53 or between the gate terminal 31 and the source terminal 32, respectively. Referring to the explanation provided with reference to FIG. 1, this drive voltage is dependent on the load voltage of the first semiconductor device 2, or is dependent on the load voltage of another one of the second transistors 3. How far the depletion region expands perpendicular to the sidewalls $52_2$, $52_3$ is also dependent on the magnitude of the control voltage applied between the gate terminal 31 and the source terminal 32. Thus, the thickness of the semiconductor fin 52 and the doping concentration of the body region 55 are also designed dependent on the magnitude of the control voltage that can occur during the operation of the semiconductor device arrangement.

Implementing the FINFETs illustrated in FIGS. 9A to 9C and 10A to 10C as U-shape-surround-gate-FINFET, in which the channel (body region) 55 has an U-shape and the gate electrode 56 is also arranged on sidewalls $52_2$, $52_3$ and on a top surface $52_1$ of the semiconductor fin 130 is only an example. These FINFETs could also be modified (not illustrated) to have the gate electrode 56 implemented with two gate electrode sections arranged on the sidewalls $52_2$, $52_3$ but not on the top surface $52_1$ of the semiconductor fin 52. A FINFET of this type can be referred to as double-gate FINFET. Each of the FINFETs explained above and below can be implemented as U-shape-surround-gate-FINFET or as double-gate FINFET. It is even possible to implement the individual second transistors 3 as different types of MOSFETs or FINFETs in one integrated circuit.

In the embodiment shown in FIG. 8, the first semiconductor device 2 and the second transistors 3 are implemented as U-shape-surround-gate FINFETs or as double-gate FINFETs. In FIG. 8, like features have like reference characters as in FIGS. 9A-9C, 10A-10C, respectively. Referring to FIG. 8, the active regions of neighboring second transistors 3 are insulated from each other by insulation structures 59 which extend in a vertical direction of the semiconductor fin 52. The insulation structures 59 extend from sidewall to sidewall of the semiconductor fin 52. However, this is out of view in FIG. 8. The active regions of the first semiconductor device 2 are dielectrically insulated from active regions of the 1st second transistor $3_1$ by a further insulation structure 66 that also extends in a vertical direction of the semiconductor fin 52. At least parts of the trenches and the voids of the insulation structures 59, 66 and at least parts of the trenches in which the gate electrodes $56_1$-$56_n$ are arranged, can be formed simultaneously by the same process steps.

In the first semiconductor device 2, a source region 61 and a drain region 62 are separated by a body region 63. The gate electrode 64 that is arranged in the trench (and the position of which at the sidewalls of the semiconductor fin is illustrated by dotted lines), extends from the source region 61 along the body region 63 to the drain region 62. The source region 61 is connected the first load terminal 22 that forms the first load terminal 12 of the semiconductor arrangement 1, the drain region 62 is connected to the second load terminal 23, and the gate electrode 64 is connected to the control terminal 21 that forms the control terminal 11 of the semiconductor arrangement 1. The body region 63 is also connected to the first load terminal 22.

The first semiconductor device 2 is, for example, implemented as an enhancement MOSFET. In this case, the body region 63 is doped complementarily to the source and drain regions 61, 62. In an n-type MOSFET, the source and drain regions 61, 62 are n-doped while the body region 63 is p-doped, and in a p-type MOSFET, the source and drain regions 61, 62 are p-doped while the body region 63 is n-doped.

According to one embodiment, the substrate 51 is doped complementarily to the active regions of the second transistors 3 and to the source and drain regions 61, 62 of the first semiconductor device 2. In this case, there is a junction isolation between the individual second transistors 3. According to a further embodiment (illustrated in dashed lines), the substrate is an SOI substrate and includes a semiconductor substrate 51$_1$ and an insulation layer 51$_2$ on the semiconductor substrate 51$_1$. The semiconductor fin 52 is arranged on the insulation layer. In this embodiment, there is a dielectric layer between the individual second transistors 3 in the substrate 51.

Referring to FIG. 8, the insulation structures 59, 66 may be implemented as explained herein before and a trench and a void. The trench of each insulation structure 59, 66 may be arranged between two neighboring transistors. The depth of the trench may be (almost) the same or much deeper as the depth of the transistors. The void may be arranged adjacent to the correspondent trench in a vertical direction of the semiconductor body 100. The void may be arranged in a depth that is greater than the depth of the neighboring transistors. By arranging such an insulation structure between two neighboring transistors, a maximum voltage may be isolated in a horizontal direction. The insulation structure has a small surface area in a region in which the transistors are implemented. This is advantageous in many applications. The insulation structure, however, has a wider cross-section in the region of the substrate below the transistors.

As the metal oxide transistor field effect transistor (MOSFET) channel length is scaled down more and more, suppression of off-state leakage current becomes an increasingly difficult technological challenge. A large portion of off-state leakage current is the so-called gate-induced drain leakage (GIDL) current, caused by band-to-band tunnelling in the drain region underneath the gate. The additional dielectric material within the void, between the substrate and the gate electrode of a neighboring transistor may reduce or oppress such a GIDL current.

The transistor arrangement illustrated by means of FIGS. 7 and 8 is only one example in which insulation structures according to the present invention may be used. An insulation structure comprising a trench and a void arranged below the trench in a vertical direction may be used other applications as well.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although present embodiments and its advantages have been described in detail, it should be understood that various changes, substitutions and alterations can be made herein without departing from the spirit and the scope of the invention as defined by the appended claims. With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method, comprising:
   forming a trench in a semiconductor fin, the semiconductor fin comprising active regions of at least two semiconductor devices, the trench extending from a first surface into the semiconductor fin, the trench having a first width in a horizontal direction of the semiconductor fin; and
   forming a void spaced apart from the first surface in a vertical direction of the semiconductor fin, the void having a second width in a horizontal direction that is greater than the first width,
   wherein the trench and the void are arranged adjacent to each other in the vertical direction,
   wherein the trench and the void form an insulation structure that dielectrically insulates the active regions of neighboring semiconductor devices of the semiconductor fin.

2. The method of claim 1, wherein forming the trench comprises an anisotropic etching process.

3. The method of claim 1, wherein the trench is formed before the void.

4. The method of claim 3, wherein forming the void comprises widening a lower section of the trench.

5. The method of claim 4, wherein forming the void comprises an isotropic etching process.

6. The method of claim 5, wherein forming the void further comprises:
   covering sidewalls in an upper trench section of the trench with a protection layer.

7. The method of claim 1, wherein the trench is formed in a vertical trench filled with a filling material.

8. The method of claim 7, wherein the void has a width that is smaller than a width of the vertical trench.

9. The method of claim 7, wherein the void has a width that is larger than a width of the vertical trench.

10. The method of claim 1, wherein the void is formed before the trench.

11. The method of claim 10, wherein forming the void comprises:
   forming a plurality of pre-trenches arranged next to each other in a horizontal direction of the semiconductor fin, each pre-trench extending from the first surface into the semiconductor fin in the vertical direction; and
   tempering the semiconductor fin.

12. The method of claim 11, wherein the tempering rearranges semiconductor material of the semiconductor fin such that a buried void is formed.

13. The method of claim 11, wherein the tempering is performed in a pure hydrogen atmosphere.

14. The method of claim 10, wherein the trench is formed to extend from the first surface into the semiconductor fin to the void.

15. The method of claim 1, wherein the void is formed to have one of a substantially rounded shape, a substantially rectangular shape, and a substantially rectangular shape.

16. The method of claim 1, further comprising:
sealing the trench with a dielectric material.

17. The method of claim 1, further comprising:
at least partially filling the void with a dielectric material.

18. The method of claim 1, further comprising:
completely filling the void with a dielectric material.

19. The method of claim 18, wherein the dielectric material comprises at least one of an oxide layer and a nitride.

20. The method of claim 1, wherein the trench is formed with a shape selected from the group consisting of:
elongated; and
ring-shaped.

21. The method of claim 1, wherein the at least two semiconductor devices comprise a first semiconductor device and n second semiconductor devices, with n>1.

22. The method of claim 21, wherein the first semiconductor device is a normally-off transistor and the n second semiconductor devices are normally-on transistors.

23. The method of claim 21, wherein:
the n second semiconductor devices each comprise a control terminal, a source terminal and a drain terminal;
the n second semiconductor devices are controllable by a voltage applied between their respective gate terminal and source terminal;
a first one of the n second semiconductor devices is controlled through a voltage that corresponds to a load path voltage of the first one of the n semiconductor devices; and
the other ones of the second semiconductor devices are controllable through a voltage that corresponds to a load path voltage of a least one second one of the n semiconductor devices, the load path voltage being a voltage between the drain terminal and the source terminal of the at least one second one of the n semiconductor devices.

24. The method of claim 1, wherein the at least two semiconductor devices each comprise a FINFET.

* * * * *